United States Patent
Pan et al.

(10) Patent No.: US 11,442,384 B2
(45) Date of Patent: Sep. 13, 2022

(54) WIRING STRUCTURE, FUSER DEVICE, AND IMAGE FORMING APPARATUS

(71) Applicant: Kabushiki Kaisha Toshiba, Minato-ku (JP)

(72) Inventors: Shanying Pan, Yokohama (JP); Takayuki Masunaga, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 716 days.

(21) Appl. No.: 16/507,260

(22) Filed: Jul. 10, 2019

(65) Prior Publication Data

US 2020/0081380 A1    Mar. 12, 2020

(30) Foreign Application Priority Data

Sep. 7, 2018  (JP) .............................. JP2018-167726

(51) Int. Cl.
    *G03G 15/20*    (2006.01)
    *H05K 1/02*     (2006.01)

(52) U.S. Cl.
    CPC ....... *G03G 15/2053* (2013.01); *H05K 1/0212* (2013.01); *H05K 2201/09227* (2013.01)

(58) Field of Classification Search
    CPC .............. G03G 15/20; G03G 15/2017; G03G 15/2039; G03G 15/2042; G03G 15/2053; H05K 1/02; H05K 1/0212; H05K 1/167; H05K 2201/09227; H05K 2201/09236; H05B 3/00

USPC ................. 219/216, 338, 469–470; 361/767, 361/777–778, 782–784, 803; 399/67–70, 399/328–330

See application file for complete search history.

(56) References Cited

U.S. PATENT DOCUMENTS

| | | | | |
|---|---|---|---|---|
| 6,185,383 B1 * | 2/2001 | Kanari | ............... | G03G 15/2042 399/334 |
| 2004/0232137 A1 * | 11/2004 | Cook | ................. | G03G 15/2039 219/486 |

(Continued)

FOREIGN PATENT DOCUMENTS

| | | |
|---|---|---|
| JP | 06-194993 | 7/1994 |
| JP | 2016-065914 | 4/2016 |

(Continued)

*Primary Examiner* — Tuan T Dinh
(74) *Attorney, Agent, or Firm* — Maier & Maier, PLLC

(57) ABSTRACT

According to one embodiment, a wiring structure includes a substrate, a first conductor, second conductors, a first trace, second traces, heat-generating elements, and a first protruding conductor. The second conductors are spaced apart from the first conductor in a second direction crossing a first direction and are mutually juxtaposed with spacing in the first direction. The heat-generating elements are mutually juxtaposed in the first direction and connected to the respective second conductors and the first conductor. The first protruding conductor protrudes from either of the first conductor and one of the second conductors and is connected to a first one of the heat-generating elements. The first protruding conductor is at least partly located, in the first direction, between a center of the first one of the heat-Generating elements and a center of a second one of the heat-generating elements adjacent to the first one.

8 Claims, 10 Drawing Sheets

(56) References Cited

U.S. PATENT DOCUMENTS

| | | | |
|---|---|---|---|
| 2013/0322897 A1* | 12/2013 | Yago | G03G 15/2053 399/33 |
| 2015/0086231 A1* | 3/2015 | Bush | G03G 15/2042 399/69 |
| 2016/0085187 A1 | 3/2016 | Takagi | |
| 2016/0085188 A1 | 3/2016 | Takagi | |
| 2016/0238974 A1* | 8/2016 | Kadowaki | G03G 15/2042 |
| 2017/0060054 A1 | 3/2017 | Tress et al. | |
| 2018/0052411 A1 | 2/2018 | Takagi | |
| 2018/0067428 A1 | 3/2018 | Takagi | |
| 2018/0074442 A1* | 3/2018 | Cao | G03G 15/2039 |
| 2019/0294088 A1 | 9/2019 | Pan et al. | |

FOREIGN PATENT DOCUMENTS

| | | |
|---|---|---|
| JP | 2016-065915 | 4/2016 |
| JP | 2016-145909 A | 8/2016 |
| JP | 2017-45049 | 3/2017 |
| JP | 2017-50050 A | 3/2017 |
| JP | 2019-164298 A | 9/2019 |

\* cited by examiner

WIRING STRUCTURE, FUSER DEVICE, AND IMAGE FORMING APPARATUS

CROSS-REFERENCE TO RELATED APPLICATIONS

This application is based upon and claims the benefit of priority from Japanese Patent Application No. 2018-167726, filed on Sep. 7, 2018, the entire contents of which are incorporated herein by reference.

FIELD

Embodiments described herein relate generally to a wiring structure, a fuser device, and an image forming apparatus.

BACKGROUND

Image forming apparatuses include a fuser device that fixes a toner image on a medium such paper. Such a fuser device includes, for example, a heater that heats paper on which a toner image is formed and a roller that applies pressure to the heated paper. The fuser device fuses the toner image on the medium by applying heat and pressure to the medium. A known heater includes a plurality of heat-generating elements juxtaposed to one another in a main scan direction, to be able to change an area to be heated depending on the size of the medium.

The gaps among the heat-generating elements tend to be lower in temperature than the heat-generating elements. This may cause variation in a heater temperature distribution in the main scan direction.

DETAILED DESCRIPTION

According to one embodiment, a wiring structure includes a substrate, a first conductor, a plurality of second conductors, a first trace, a plurality of second traces, a plurality of heat-generating elements, a first protruding conductor. The first conductor extends in a first direction. The plurality of second conductors is spaced apart from the first conductor in a second direction and mutually juxtaposed with spacing in the first direction, the second direction being along one face of the substrate and crossing the first direction. The first trace is or the face of the substrate, and is connected to the first conductor. The plurality of second traces is apart from the first trace on the face, and connected to the second conductors, respectively. The plurality of heat-generating elements generates heat by an applied voltage, the heat-generating elements that are spaced apart from the second traces and mutually juxtaposed with spacing in the first direction, and connected to the first conductor and to the second conductors, respectively. The first protruding conductor protrudes from either of the first conductor and one of the second conductors to a location between the first conductor and the second conductors in the second direction, and is connected to a first one of the heat-generating elements. The first protruding conductor is at least partly located between a center of the first one of the heat-generating elements and a center of a second one of the heat-generating elements in the first direction, the second one of the heat-generating elements being adjacent to the first one of the heat-generating elements.

First Embodiment

The following describes a first embodiment with reference to FIGS. 1 to 8. In this disclosure elements according to embodiments may be represented by different expressions and explained in different expressions, however, such elements and their explanations are not limited by the expressions. The elements may be identified by any names different from those used herein. Furthermore, The elements may be expressed in any way other than those expressed herein.

Figure 1:
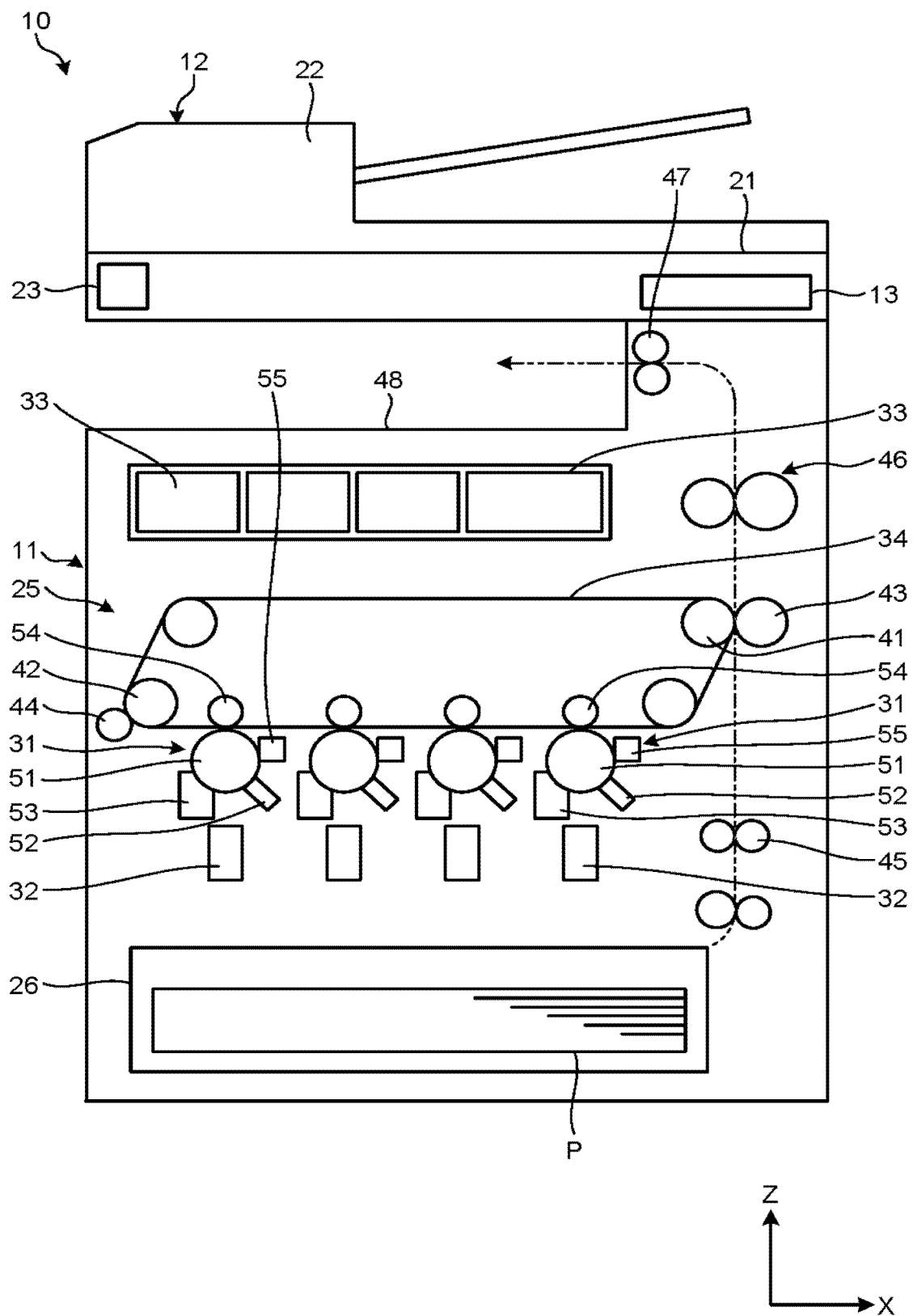
FIG. 1 is an exemplary schematic diagram illustrating an image forming apparatus according to a first embodiment.

FIG. 1 is an exemplary schematic diagram illustrating an image forming apparatus 10 according to the first embodiment. In the first embodiment, the image forming apparatus 10 represents a multi-function peripheral (IMP). The image forming apparatus 10 may nonetheless be a printer, a copier, or an apparatus that generates an image on a medium.

The image forming apparatus includes a body 11, a reader 12, and an operation unit 13. The reader 12 is located above the body 11 and includes a platen 21, an automatic document feeder 22, and an image sensor 23. The automatic document feeder 22 is disposed on the platen 21.

The image sensor 23 reads a document placed on the platen 21 or fed through the automatic document feeder 22 to generate image data. The image sensor 23 is disposed in a main scan direction. The image sensor 23 reads an image of each page of the document line by line.

The apparatus body 11 includes a printer 25 and a paper feed cassette 26. The paper feed cassette 26 located below the printer 25. The paper feed cassette 26 can store a plurality of sheets of paper P. The paper P is an exemplary medium. The medium may be any other printable medium.

The printer 25 generates an image on the paper P from image data read by the image sensor 23, image data input from an external device such as a personal computer, or image data stored in an information storage medium such as a memory card. The printer 25 represents, for example, a tandem color laser printer. The printer 25 may be any other printer.

The printer 25 includes four image forming units 31, four laser exposure units 32, and four toner cartridges 33 for yellow (Y), magenta (M), cyan, and black (K). The printer 25 further includes an intermediate transfer belt 34, a drive roller 41, a driven roller 42, a belt cleaner 44, a paper feed roller 45, a fuser device 46, a conveyor roller 47, and a paper output 46. The four image forming units 31 are disposed along the intermediate transfer belt 34.

The image forming units 31 each include a photoconductive drum 51, a charger 52, a developing unit 53, a primary transfer roller 54, and a cleaner 55. The charger 52, the developing unit 53, the primary transfer roller 54, and the cleaner 55 are disposed around the photoconductive drum 51.

Irradiated with light from the laser exposure unit 32, an electrostatic latent image is generated on the photoconductive drum 51. The charger 52 uniformly charge the surface of the photoconductive drum 51. The developing unit 53 uses, for example, a developing roller to supply the photoconductive drum 51 with a two-component developer including toner and carrier to thereby develop the electrostatic latent image. The cleaner 55 removes remnant toner on the photoconductive drum with, for example, a blade.

The four toner cartridges 33 house toner of yellow (Y), magenta (M), cyan (C), and black (K), respectively. The toner cartridges 33 supply the toner to the developing units 53 of the corresponding image forming units 31.

The drive roller 41 and the driven roller 42 circulate the intermediate transfer belt 34. The intermediate transfer belt 34 passes between the photoconductive drums 51 and the primary transfer rollers 54 of the four image forming units 31. Applied with a primary transfer voltage, the primary transfer rollers 54 primarily transfer toner images onto the intermediate transfer belt 34 from the photoconductive drums 51.

The intermediate transfer belt 34 passes between the drive roller 41 and a secondary transfer roller 43. The secondary transfer roller 43 is applied with a secondary transfer voltage at the timing when the paper P passes between the drive roller 41 and the secondary transfer roller 43, to secondarily transfer the toner images from the intermediate transfer belt 34 to the paper P. The belt cleaner 44 removes remnant toner on the intermediate transfer belt 34.

The paper feed roller 45 is disposed between the paper feed cassette 26 and the secondary transfer roller 43. The paper feed roller 45 extracts and feeds the paper P from the paper feed cassette 26. The fuser device 46 is located downstream of the secondary transfer roller 4 fix the toner images on the paper P. The conveyor roller 47 is located downstream of the fuser device 46 to eject the paper P to the paper output 46.

Figure 2:
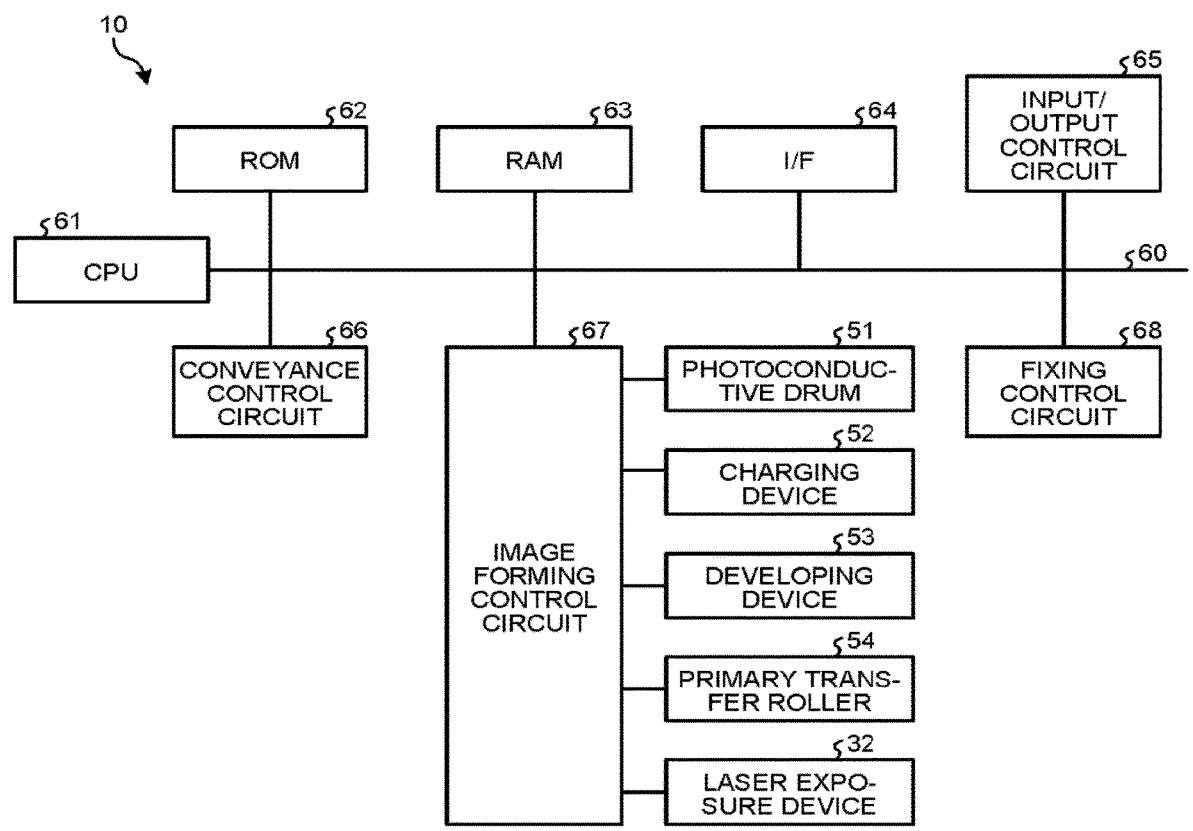
FIG. 2 is an exemplary block diagram illustrating a hardware configuration of the image forming apparatus in the first embodiment.

FIG. 2 is an exemplary block diagram illustrating a hardware figuration of the image forming apparatus 10 in the first embodiment. As illustrated in FIG. 2, the image forming apparatus 10 includes a CPU 61, a ROM 62, a RAM 63, an interface (I/F) 64, an input/output control circuit 65, a conveyor control circuit 66, an image-formation control circuit 67, and a fuser control circuit 66, which are connected to one another via, for example, bus 60.

The CPU 61 is a computation device that controls the overall processing of the image forming apparatus 10. The ROM 62 stores programs and data for implementing various operations to be performed by the CPU 61. The RAM 63 stores data required for various operations by the CPU 61. The I/F 64 is connected to an external device or an external terminal via, for example, a communication line to transmit and receive data to and from the external device or the external terminal.

The programs for implementing various operations of the CPU 61 are incorporated in advance and provided in, for example, the ROM 62. The programs may also be recorded and provided in an installable or executable file format on a computer-readable recording medium, such as a compact disc-read only memory (CD-ROM), a flexible disk (FD), a compact disc recordable (CD-R), and a digital versatile disc (DVD).

Alternatively, the programs to be executed by the CPU 61 may be stored in a computer connected via a network such as the Internet and downloaded therefrom via the network. The programs may be provided or distributed via a network such as the Internet.

The input/output control circuit 65 controls the operation unit 13. The conveyor control circuit 66 controls a plurality of motors that drives the paper feed roller 45, the conveyor roller 47, and various rollers for conveying the paper P. The image-formation control circuit 67 controls the laser exposure units 32, the photoconductive drums 51, the chargers 52, the developing units 53, and the primary transfer rollers 54. The fuser control circuit 68 controls the fuser device 46. The input/output control circuit 65, the conveyor control circuit 66, the image-formation control circuit 67, and the fuser control circuit 68 are all controlled by the CPU 61, however, they may be controlled by individual arithmetic processing units.

Figure 3:
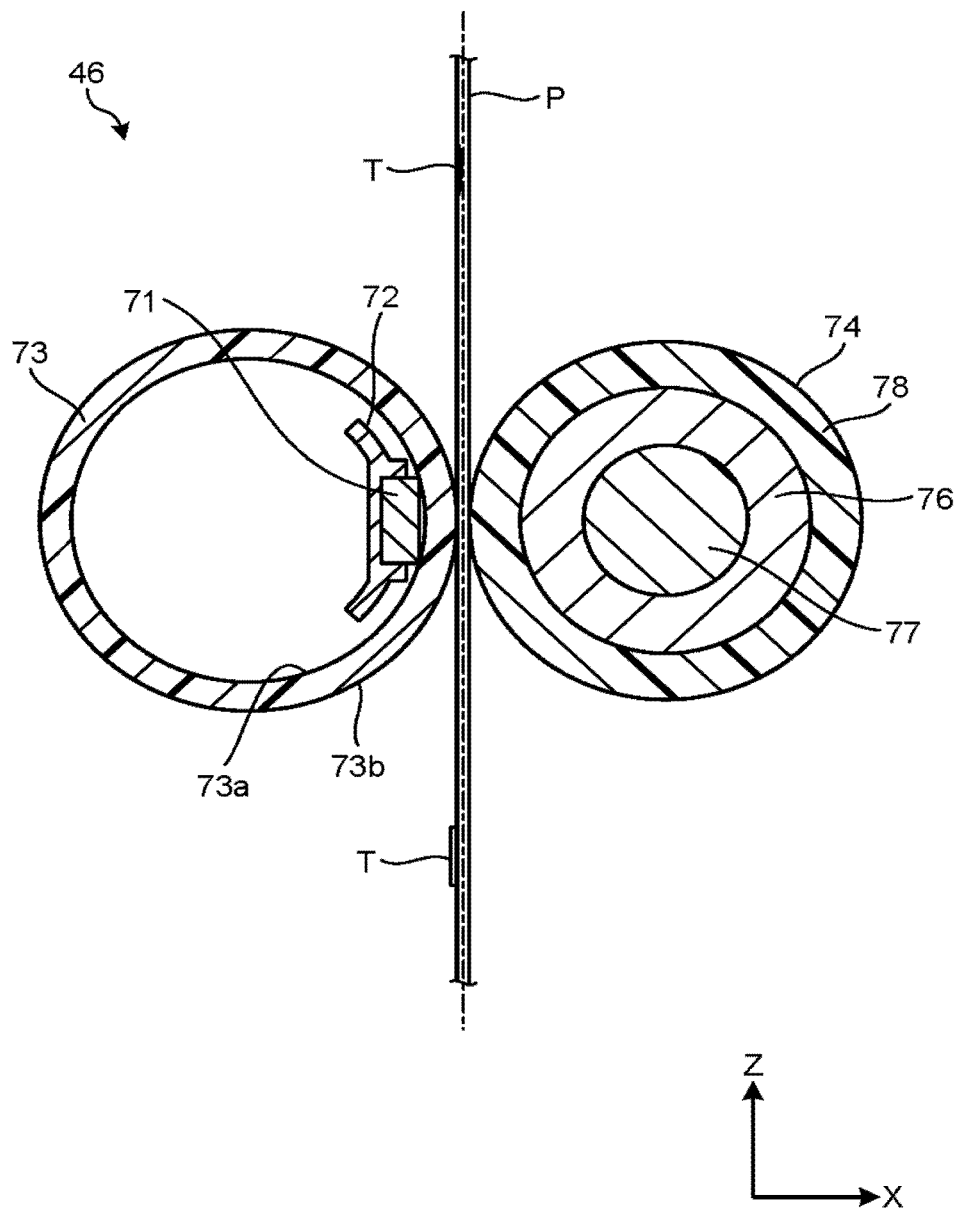
FIG. 3 is an exemplary cross-sectional view schematically illustrating a fuser device in the first embodiment.

FIG. 3 is an exemplary schematic cross-sectional view illustrating the fuser device 46 in the first embodiment. As illustrated in FIG. 3, the fuser device 46 includes a heater 71, a heater holder 72, a fuser belt 73, and a pressure roller 74. The heater 71 is an exemplary wiring structure. The pressure roller 74 is an exemplary roller.

The heater holder 72 holds the heater 71. The fuser belt 73 has a substantially cylindrical shape to surround the heater holder 72 rotatably about the heater holder 72. The fuser belt 73 has an inner surface 73a and an outer surface 73b. The heater 71, held by the heater holder 72, faces the inner surface 73a of the fuser belt 73. The fuser belt 73 is formed of, for example, a heat-resistant resin such as polyimide resin.

The pressure roller 74 includes a rotor 76, a rotary shaft 77, and a resin layer 76. The fuser control circuit 68 drives a motor connected to the rotary shaft 77, to rotate the rotor 76 about the rotary shaft 77, for example. The resin layer 78 is formed of, for example, a heat-resistant resin such as silicone resin and laminated on the outer surface of the rotor 76. The pressure roller 74 is pressed against the outer surface 73b of the fuser belt 73. The heater 71 faces the pressure roller 74 across the fuser belt 73.

The paper P, onto which a toner image T has been secondarily transferred by the secondary transfer roller 43, passes between the fuser belt 73 and the pressure roller 74. The heater 71 heats the paper P while the pressure roller 74 applies pressure to the paper P. Thereby, the toner image T is melted by heat and fused on the surface of the paper P.

Figure 4:
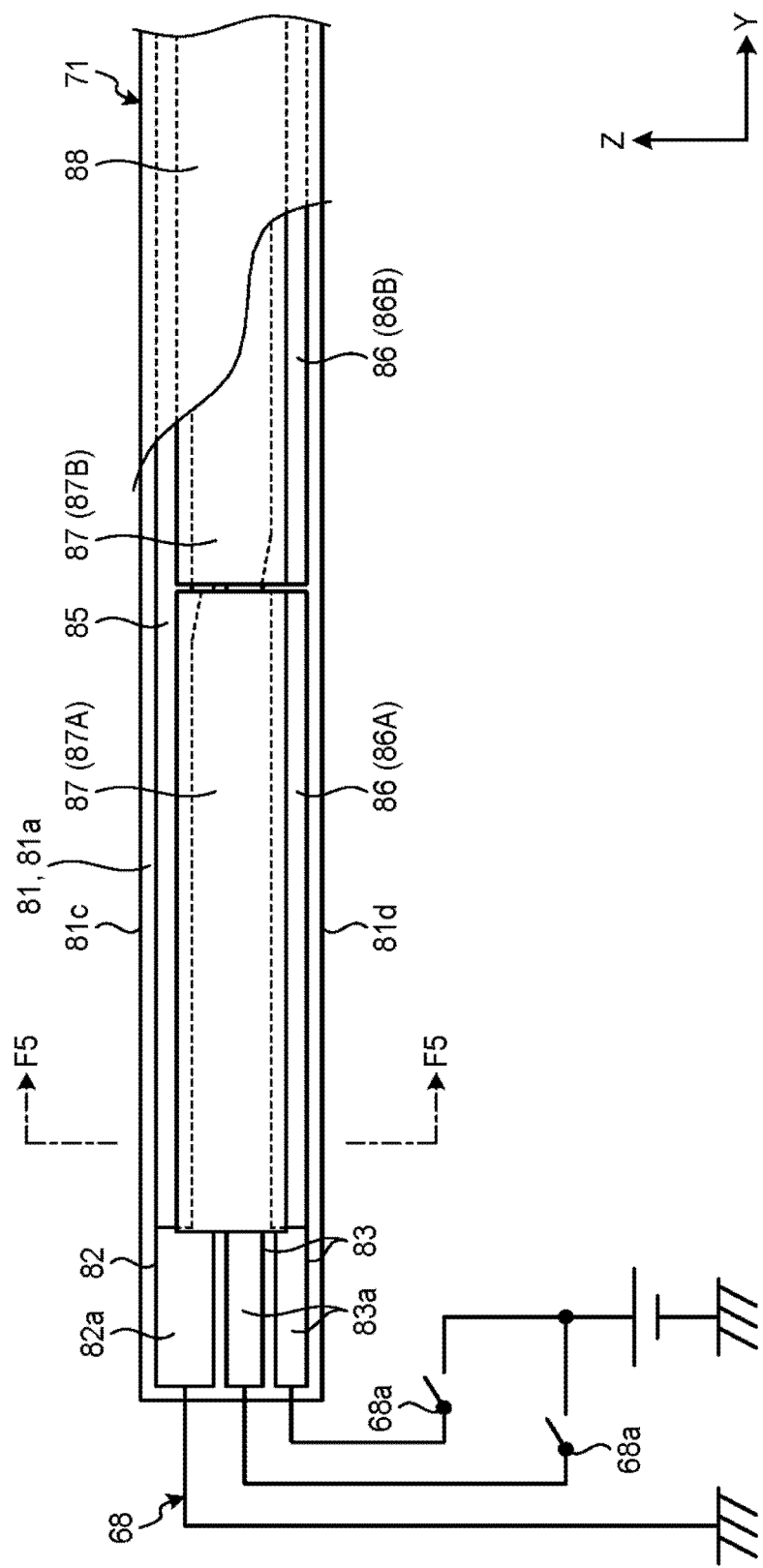
FIG. 4 is an exemplary schematic plan view illustrating a fuser control circuit and a heater in the first embodiment.
Figure 5:
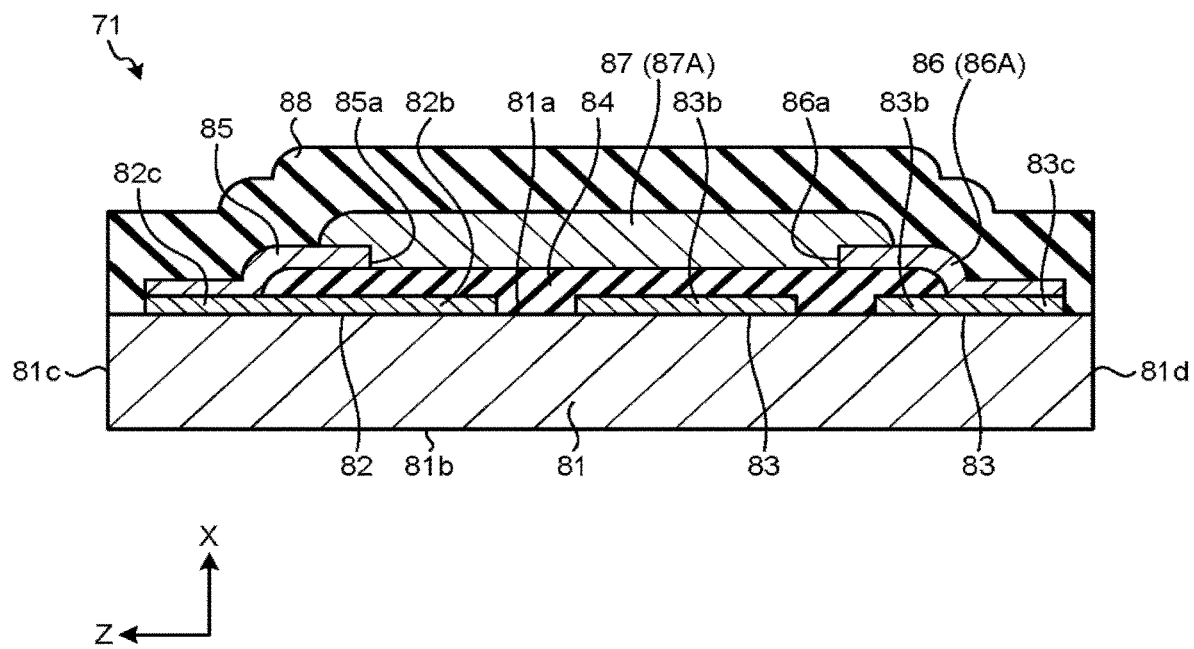
FIG. 5 is an exemplary schematic cross-sectional view illustrating the heater in the first embodiment, taken along line F5-F5 in FIG. 4.

FIG. 4 is an exemplary schematic plan view illustrating the fuser control circuit 68 and the heater 71 in the first embodiment. FIG. 5 is an exemplary schematic cross-sectional view of the heater 71 in the first embodiment taken along line F5-F5 in FIG. 4. As illustrated in FIG. 5, the heater 71 includes a substrate 81, a first trace 82, a plurality of second traces 83, an insulating layer 84, a first conductor 85, a plurality of second conductors 86, a plurality of heat-generating elements 87, and a protective layer 88.

In this disclosure, as illustrated in FIGS. 4 and 5, an X-axis, a Y-axis, and a Z-axis are defined for the sake of convenience. The X-axis, the Y-axis, and the Z-axis are orthogonal to one another. The X-axis is along the thickness of the heater 71. The Y-axis is along the length of the heater 71. The Z-axis is along the width of the heater 71.

The substrate 81 is formed of, for example, ceramic and has a rectangular plate shape extending in the Y-axis direction. The Y-axis direction corresponds to a main scan direction. The substrate 81 has a first face 81*a*, a second face 81*b*, a first end 81*c*, and a second end 81*d*. The first face 81*a* is an exemplary face.

The first face 81*a* is a substantially flat face facing in a positive direction of the X-axis as indicated by the arrow X in FIG. 5). The second face 81*b* is opposite the first face 81*a* and is substantially flat, facing in a negative direction of the X-axis (opposite to the arrow X in FIG. 5).

The first end 81*c* is an end of the substrate 81 in a positive direction of the Z-axis (as indicated by the arrow Z in FIG. 5). The second end 81*d* is an end of the substrate 81 in a negative direction of the Z-axis (opposite to the arrow Z in FIG. 5) and is opposite the first grid 81*c*.

The first trace 82 and the second traces 83 are laid on the first face 81*a* of the substrate 81. The first trace 82 is connected to a ground. Voltage is applied to the second traces 83 under the control of the CPU 61.

Figure 6:
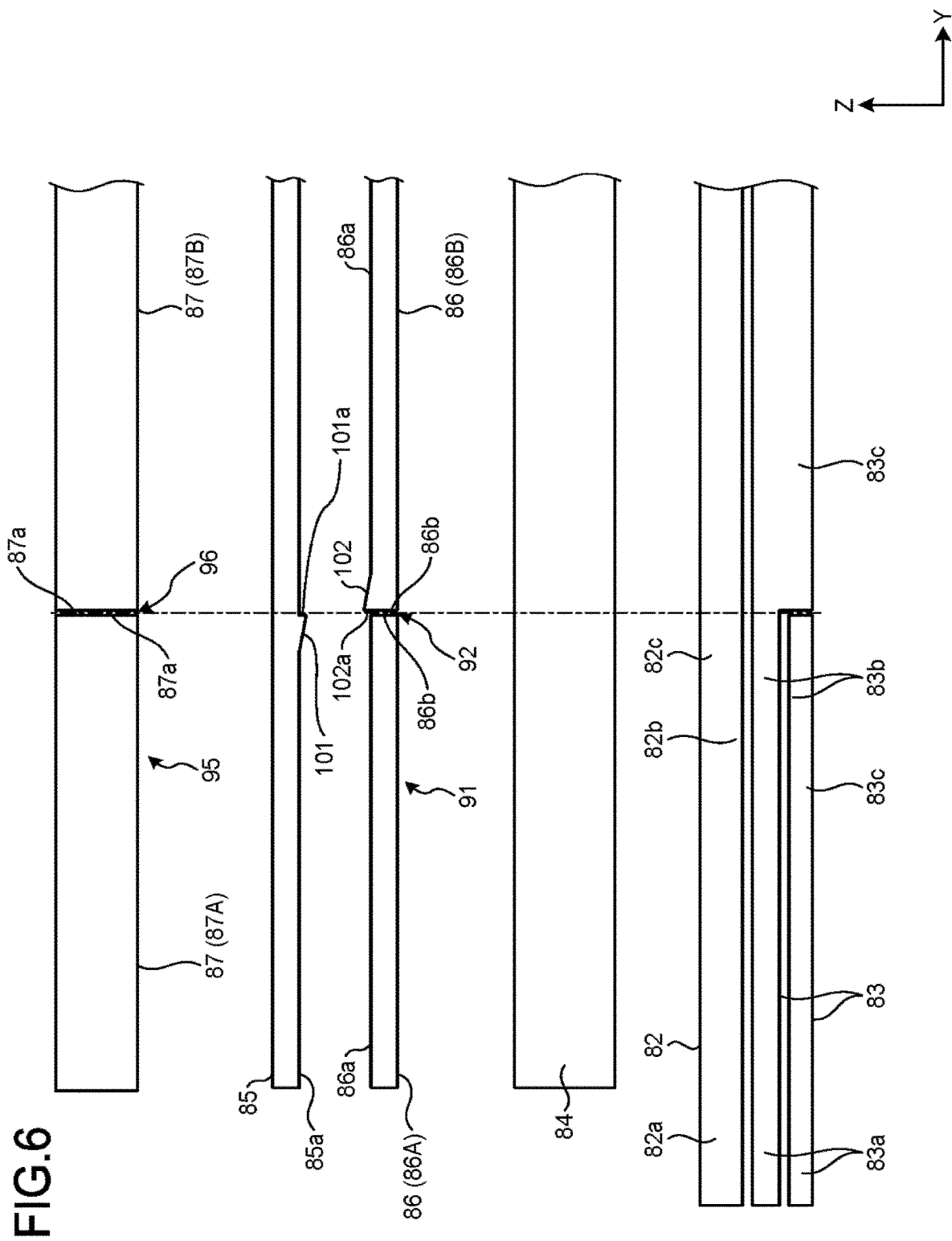
FIG. 6 is an exemplary schematic exploded plan view illustrating a first trace, a second trace, an insulating layer, a first conductor, a second conductor, and a heat-generating element in the first embodiment.

FIG. 6 is an exemplary schematic exploded plan view illustrating the first trace 82, the second traces 83, the insulating layer 84, the first conductor 85, the second conductors 86, and the heat-generating elements 87 in the first embodiment. As illustrated in FIG. 6, the first trace 82 includes a terminal 82*a*, a trace 82*b*, and an electrode 82*c*.

The terminal 82*a* is situated at a Y-axial end of the substrate 81. The trace 82*b* extends in the Y-axis direction to be connected to the terminal 82*a* and the electrode 82*c*. The electrode 82*c* extends along the first end 81*c* of the substrate 81. The trace 82*b* may be omitted, so that the electrode 82*c* can be connected to the terminal 82*a*.

The second traces 83 are spaced apart from the first trace 82 in the negative direction of the Z-axis. The second traces 83 are also spaced apart from each other. The second traces 83 each include a terminal 83*a*, a trace 83*b*, and an electrode 83*c*.

The terminal 83*a* is situated at the Y-axial end of the substrate 81. The trace 83*b* extends in the Y-axis direction to be connected to the terminal 83*a* and the electrode 83*c*. The electrode 83*c* extends along the second end 81*d* of the substrate 81 to be connected to the corresponding second conductor 86. The trace 83*b* may be omitted, so that the electrode 83*c* can be connected to the terminal 83*a*.

The terminal 82*a* of the first trace 82 and the terminals 83*a* of the second traces 83 are spaced apart from each other in the Z-axis direction. The Z-axis direction corresponds to a sub-scan direction. The Z-axis direction is along the first face 81*a* of the substrate 81, crossing or orthogonal to the Y-axis direction. The electrodes 83*c* of the second traces 83 are spaced apart from each other in the Y-axis direction.

As illustrated in FIG. 5, the insulating layer 84 covers the trace 82*b* of the first trace 82 and the traces 83*b* of the second traces 83. The terminal 82*a* and the electrode 82*c* of the first trace 82, and the terminals 83*a* and the electrodes 83*c* of the second traces 83 are not covered by the insulating layer 84 but exposed.

As illustrated in FIG. 6, the first conductor extends in the Y-axis direction. The Y-axis direction is an exemplary first direction. The Y-axis direction includes a positive direction of the Y-axis (as indicated by the arrow Y in FIG. 6) and a negative direction of the Y-axis (opposite to the arrow Y in FIG. 6). As illustrated in FIG. 5, one part of the first conductor 85 is connected to the electrode 82*c* of the first trace 82. The other part of the first conductor 85 covers a part of the insulating layer 84.

Figure 7:
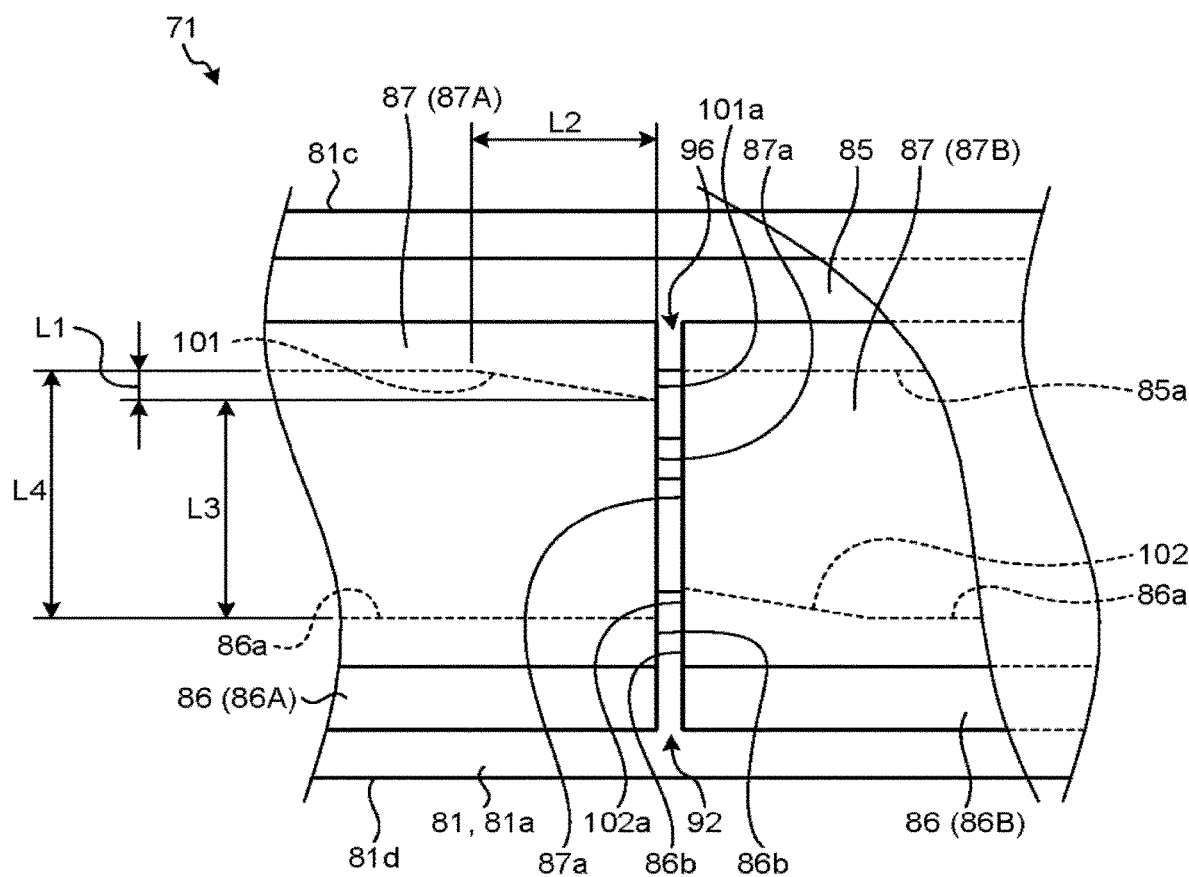
FIG. 7 is an exemplary schematic plan view illustrating a part of the heater in the first embodiment.

FIG. 7 is an exemplary schematic plan view illustrating a part of the heater 71 in the first embodiment. FIG. 7 does not illustrate the insulating layer 84 and the protective layer 88. As illustrated in FIG. 7, the first conductor 85 has a first edge 85*a*. The first edge 85*a* is the edge of the first conductor 85 in the negative direction of the Z-axis and extends substantially linearly in the Y-axis direction. The first edge 85*a* faces the second conductors 86.

The second conductors 86 are spaced apart from the first conductor 85 in the Z-axis direction. The Z-axis direction is an exemplary second direction and includes the positive direction and the negative direction of the Z-axis. In the first embodiment, the second conductors 86 are spaced apart from the first conductor 85 in the negative direction of the Z-axis.

As illustrated in FIG. 6, the second conductors 86 are juxtaposed to each other with spacing in the Y-axis direction, forming a row 91. Thus, the second conductors 86 extend in the Y-axis direction as a whole. The second conductors 86 have substantially the same width as the first conductor 85 has in the Z-axis direction.

The second conductors 86 each have a second edge 86*a* and an end 86*b*. The second edge 86*a* is the end of the second conductor 86 in the positive direction of the Z-axis and extends substantially linearly in the Y-axis direction. The second edge 86*a* faces the first conductor 85. The end 86*b* is the Y-axial end of the second conductor 86 and extends substantially linearly in the Z-axis direction.

Every two adjacent second conductors 86 are placed with a gap 92. The gap 92 lies between the end 86*b* of one of the adjacent second conductors 86 and the end 86*b* of the other. The gap 92 may he referred to also as an opening, a slit, a groove, or an interval. The gap 92 extends in Z-axis direction to isolate the two adjacent second conductors 86 from each other. The gap 92 is aligned with the gap between the two adjacent electrodes 83*c* of the second traces 83 in the X-axis direction.

In the following, the second conductors 86 may be distinctively referred to as second conductors 86A and 86B. The second conductor 86A represents one of the second conductors 86 at the end of the row 91. The second conductor 86B represents one of the second conductors 86 adjacent to the second conductor 86A in the row 91.

As illustrated in FIG. 5, the second conductors 86A and 86B are partly connected to the electrodes 83*c* of the corresponding second traces 83. The rest of the second conductors 86A and 86B cover a part of the insulating layer 84.

The heat-generating elements 87 represent an electric resistor such as a ceramic heater which generates heat when applied with a voltage. As illustrated in FIG. 6 the heat-generating elements 87 have a substantially rectangular shape extending in the Y-axis direction. The heat-generating elements 87 may have any other shape.

The heat-generating elements 87 are juxtaposed to each other with spacing in the Y-axis direction, forming a row 95. The heat-generating elements 87 extend in the Y-axis direction as a whole. In other words, one heat-generating element 87 is divided into multiple heat-generating elements 87 in the Y-axis direction.

The heat-generating elements 87 each have an end 87*a*. The end 87*a* is the Y-axial end of the heat-generating element 87 and extends substantially linearly in the Z-axis direction. The end 87*a* is aligned with the end 86*b* of the second conductor 86 in the X-axis direction.

The two adjacent heat-generating elements 87 are placed with a gap 96. The gap 96 lies between the end 87*a* of one of the two adjacent heat-generating elements 87 and the end 87*a* of the other. The gap 96 extends in the Z-axis direction to isolate the two adjacent heat-generating elements 87 from each other. The gap 96 is aligned with the gap 92 and the gap between the two adjacent electrodes 83*c* of the second traces 83 in the X-axis direction.

As illustrated in FIG. 5, the heat-generating elements 87 cover the insulating layer 84 and are connected to the first conductor 85 and the corresponding second conductors 86. The insulating layer 84 isolates the heat-generating elements 87 from the first trace 32 and the second traces 83. Thus, the heat-generating elements 87 are spaced apart from the first trace 82 and the corresponding second traces 83 via the insulating layer 84.

In the following, the heat-generating elements 87 may be distinctively referred to as heat-generating elements 87A and 87B. The heat-generating element 87A is connected to the second conductor 86A. The heat-generating element 878 is connected to the second conductor 865.

As illustrated in FIG. 6, in the first embodiment, the heat-generating element 87A has a length substantially equal to a length of the second conductor 86A in the Y-axis direction. The heat-generating element 87B has a length substantially equal to a length of the second conductor 865 in the Y-axis direction. The heat-generating elements 87 may differ in length from their corresponding second conductors 86.

As illustrated in FIG. 5, the protective layer 88 covers the first face 81*a* of the substrate 81, the first trace 82, the second traces 83, the insulating layer 84, the first conductor 85, the second conductors 86, and the heat-generating elements 87. The terminal 82*a* of the first trace 82 and the terminals 83*a* of the second traces 83 are not covered by the protective layer 88 but exposed.

Referring to FIG. 4, the exposed terminal 82*a* of the first trace 82 is electrically connected to, for example, a ground. The exposed terminals 83*a* of the second traces 83 are electrically connected to, for example, switching elements 68*a* of the fuser control circuit 68. The fuser control circuit 68 can selectively apply a voltage to at least one of the second traces 83. The second traces 83 may be electrically connected to another elements, such as FETs, instead of the switching elements 68*a*.

By an applied voltage to the second traces 83, the heat-generating elements 87 are applied with the voltage from the electrodes 93*c* of the second traces 83 through the corresponding second conductors 86. The applied voltage causes the heat-generating elements 87 to generate heat. A current flows from the heat-generating elements 87 to the first trace 82 through the first conductor 85.

The second traces 93 are connected in parallel. Thus, a voltage is uniformly applied to the second traces 83. An alternating-current voltage or a direct-current voltage may be applied to the second traces 83.

As illustrated in FIG. 6, the heater 71 further includes a first protrusion 101 and a second protrusion 102. In the first embodiment, the first protrusion 101 and the second protrusion 102 are exemplary first protruding conductors.

The first protrusion 101 is integrated with the first conductor 85. That is, the first protrusion 101 constitutes the first conductor 85. The first protrusion 101 is thus electrically conductive. The first protrusion 101 and the first conductor 85 are connected to the heat-generating element 87A.

The first protrusion 101 protrudes from the first edge 85*a* of the first conductor 85 toward the second conductor 86A. Thus, the first protrusion 101 is located between the first conductor 85 and the second conductors 86 in the Z-axis direction. The first protrusion 101 may protrude from the first edge 85*a* of the first conductor 85 toward the second conductor 86B. The first protrusion 101 is spaced apart from the second conductors 86.

The first protrusion 101 is located near the gap 96 between the heat-generating element 87A connected to the first protrusion 101 and the adjacent heat-generating element 87B. Thus, the first protrusion 101 is at least partly located between e centers of the two adjacent heat-generating elements 87A and 87B in the Y-axis direction. Moreover, at least part of the first protrusion 101 is closer to the gap 96 between the adjacent heat-generating elements 87A and 87B than to the center of the heat-generating element 87A in the Y-axis direction.

The first protrusion 101 has a substantially right triangular shape. The first protrusion 101 has a axial length L1 which elongates toward the gap 96. The Z-axial length L1 of the first protrusion 101 is shorter than a half of the Z-axial length of the heat-generating element 87A. A Y-axial end 101*a* of the first protrusion 101 extends in the Z-axis direction and is aligned with the end 87*a* of the heat-generating element 87A in the X-axis direction.

The first protrusion 101 has a length L2 shorter than the length of the heat-generating element 87A in the Y-axis direction. Specifically, the first protrusion 101 is disposed locally in the first conductor 85. The length L2 of the first protrusion 101 may be equal to the length of the heat-generating element 87A in the Y-axis direction.

The second protrusion 102 is integrated with the second conductor 86B. In other words, the second protrusion 102 constitutes the second conductor 86B. The second protrusion 102 is thus electrically conductive. The second protrusion 102 and the second conductor 86B are connected to the heat-generating element 87B.

The second protrusion 102 protrudes from the second edge 86*a* of the second conductor 86B toward the first conductor 85. Thus, the second protrusion 102 is located between the first conductor 85 and the second conductors 86 in the axis direction. The second protrusion 102 may protrude from the second edge 86*a* of the second conductor 86A toward the first conductor 85. The second protrusion 102 is spaced apart from the first conductor 85.

The second protrusion 102 is located near the gap 96 between the heat-generating element 87B connected to the second protrusion 102 and the adjacent heat-generating element 87A. Thus, the second protrusion 102 is at least partly located between the centers of the two adjacent heat-generating elements 87B and 87A in the Y-axis direction. Moreover, at least part of the second protrusion 102 is located closer to the gap 96 between he heat-generating element 87B and 87A than to the center of the heat-generating element 87B in the Y-axis direction.

The second protrusion 102 has a substantially right triangular shape. The second protrusion 102 has a Z-axial length which elongates toward the gap 96. The length of the second protrusion 102 is substantially equal to the length L1 of the first protrusion 101 in the Z-axis direction. A Y-axial end 102*a* of the second protrusion 102 is continuous with the end 86*b* of the second conductor 86B in the Z-axis direction and is aligned with the end 87*a* of the heat-generating element 87B in the X-axis direction.

The second protrusion 102 is shorter in length than the heat-generating element 87B in the Y-axis direction. Specifically, the second protrusion 102 is disposed locally in the second conductor 86B. The length of the second protrusion 102 may be equal to the length of the heat-generating element 87B in the Y-axis direction. The length of the second protrusion 102 is substantially equal to the length L2 of the first protrusion 101 in the Y-axis direction. The first protrusion 101 may nonetheless differ in dimensions from the second protrusion 102.

The image forming apparatus 10 described above fixes the toner image on the paper P in the following manner, by way of example. Method by which the image forming apparatus 10 fixes the toner image T on the paper P is not limited to the following method.

For example, the reader 12 illustrated in FIG. 1 uses the image sensor 23 to read the document and generates image data. The CPU 61 illustrated in FIG. 2 loads an image-formation control program for the image forming units 31 and a fuser control program for the fuser device 46 from the ROM 62 for execution.

The CPU 61 processes the generated image data. The CPU 61 controls the image-formation control circuit 67 by the image-formation control program to thereby generate electrostatic latent images on the photoconductive drums 51 and to develop the electrostatic latent images by the developing units 53. The primary transfer roller 54 then primarily transfers a toner image T onto the intermediate transfer belt 34 and the secondary transfer roller 43 secondarily transfers the toner image T onto the paper P.

Meanwhile, the CPU 61 obtains information on the size of the paper P from, for example, a line sensor that detects the size of the passing paper P or from an input to the operation unit 13. The CPU 61 controls the fuser control circuit 68 by the fuser control program to cause at least one of the heat-generating elements 87 to generate heat, the one in a location where the paper P is to pass.

Specifically, the fuser control circuit 68 turns on at least one of the switching elements 68a illustrated in FIG. 4 corresponding to the heat-generating element 87 located where the paper P is to pass. Thereby, the heat-generating element 87 corresponding to the size of the passing paper P is applied with a voltage to generate heat and raise the surface temperature of the heater 71.

The paper P, to which the toner image T has been transferred, is fed to the fuser device 46 while the heater 71 has risen to a given surface temperature. In the user device 46, the paper P, on which the toner image T has been formed, is subjected to the heat from at least one of the heat-generating elements 87 and the pressure by the pressure roller 74. Thereby, the toner image T is melted and fixed on the paper P only the heat-generating element 17 corresponding to the size of the paper P generates heat, which leads to reducing unnecessary heating and the power consumption of the heater 71, compared with the heat generation by all the heat-generating elements 87, i.e., the entire area of the heater 71 in the main scan direction, regardless of the size of the paper P.

The calorific value of the heat-generating element 87 is, typically, substantially in proportion to current density and substantially in inverse proportion to electrical resistance in the heat-generating element 87. For example, shortening the distance of an electrical path between the first conductor 85 and the second conductor 86 makes it possible to decrease the electrical resistance and increase the current density in the heat-generating element 87.

As illustrated in FIG. 7, a distance L3 between the first protrusion 101 of the first conductor 85 and the second conductor 86A is shorter than a distance L4 between the first edge 85a of the first conductor 85 and the second conductor 86A. Specifically, the first protrusion 101 serves to shorten the electrical path between the first conductor 85 and the second conductor 86 in the vicinity of the gap 96. Thus, the heat-generating element 87A generates a greater amount of heat from the portion near the gap 96 than from the portion away from the gap 96

The distance between the second protrusion 102 of the second conductor 86B and the first conductor 85 is substantially equal to the distance L3. The distance between the second edge 86a of the second conductor 86B and the first conductor 85 is substantially equal to the distance L4. Specifically, the second protrusion 102 serves to shorten the electrical path between the first conductor 85 and the second conductor 86 in the vicinity of the gap 96. Thus, the heat-generating element 87B generates a greater amount of heat from the portion near the gap 96 than from the portion away from the gap 96.

Figure 8:
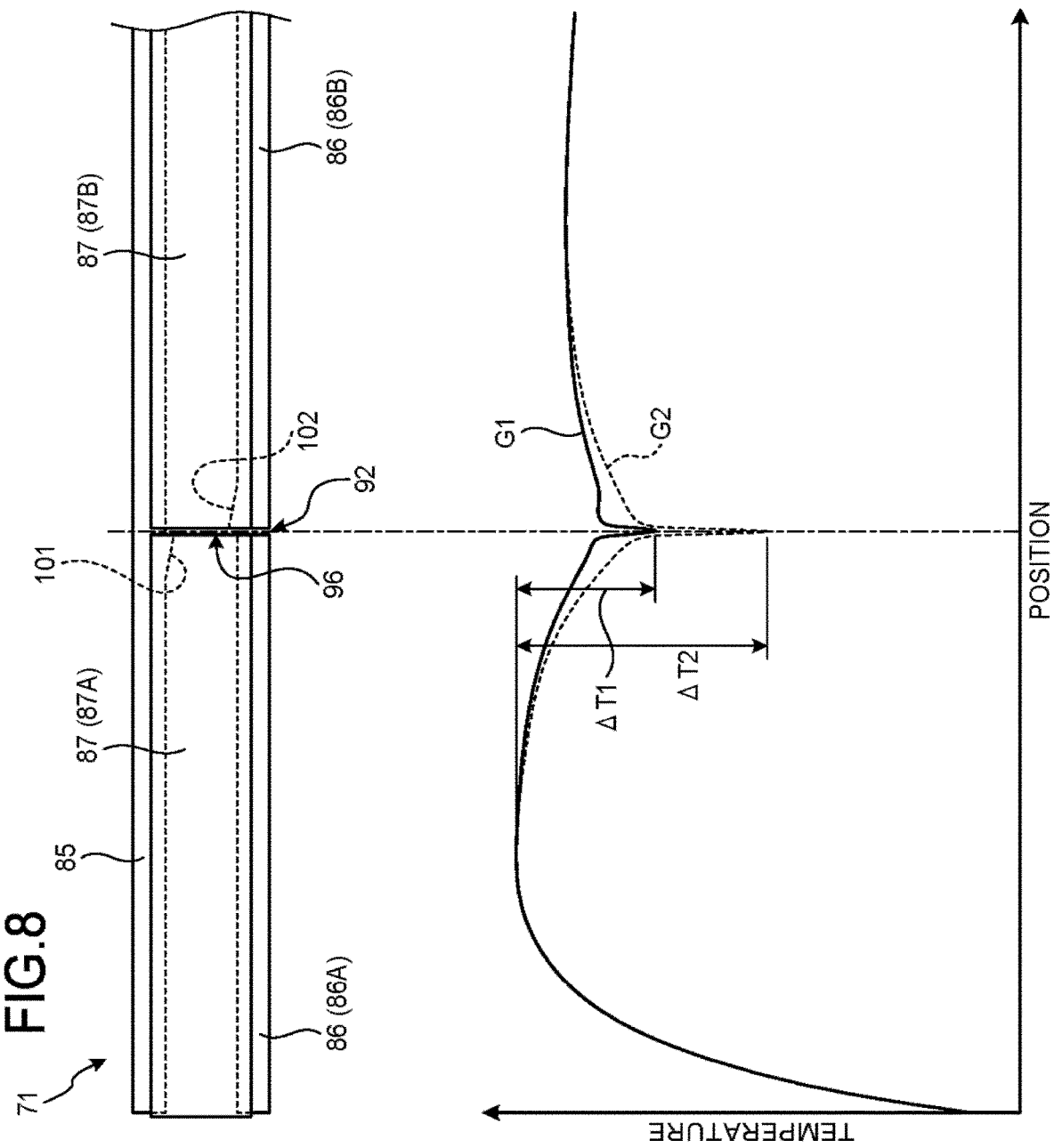
FIG. 8 is an exemplary schematic diagram illustrating a temperature distribution of the heater in the first embodiment.

FIG. 8 is an exemplary schematic diagram illustrating a temperature distribution of the heater 71 in the first embodiment. In FIG. 8 a graph G1 indicated by the solid line denotes an example of the temperature distribution of the heater 71 at different positions in the first embodiment. Also, a graph G2 indicated by the broken line in FIG. 8 denotes an example of the temperature distribution of a heater 71 for comparison at different positions. The heater 71 for comparison includes neither the first protrusion 101 nor the second protrusion 102.

As illustrated in FIG. 8, the temperature at the gap 96 is lower than the temperatures at the positions of the heat-generating elements 67. In the heater 71 in the first embodiment, a difference between a minimum temperature at the gap 96 and a maximum temperature at the positions of the heat-generating elements 87 is represented by a temperature difference $\Delta T1$. In the heater 71 for comparison, a difference between a minimum temperature at the gap 96 and a maximum temperature at the positions of the heat-generating elements 87 is represented by a temperature difference $\Delta T2$.

As described above, in the heater 71 of the first embodiment, the heat-generating elements 87A and 87B exhibit greater calorific values in the vicinity of the gap 96. In the heater 71 for comparison, the heat-generating elements 87A and 87B exhibit substantially uniform calorific values. Thus, the temperature difference $\Delta T1$ in the first embodiment is smaller than the comparative temperature difference $\Delta T2$ Specifically, the heater 71 in the first embodiment exhibits a more uniform temperature distribution than the heater 71 for comparison does.

By elongating the Z-axial length L1 of the first protrusion 101 illustrated in FIG. 7, the calorific value of the heat-generating element 87A near the gap 96 can be further increased to further decrease the temperature difference $\Delta T1$. Also, by elongating the Y-axial length L2 of the first protrusion 101, the temperature difference $\Delta T1$ can be further decreased. The ratio of the decrease in the temperature difference $\Delta T1$ to the increase in the length L1 is greater than the ratio of the decrease in the temperature difference $\Delta T1$ to the increase in the length L2.

The first trace 82, the second traces 83, the insulating layer 84, the first conductor 85, the second conductors 86, the heat-generating elements 87, and the protective layer 88 can be formed on the substrate 81 by ink jet printing of materials, for example. The heater 71 may be fabricated by any method other than ink jet printing.

The first trace 82, the second traces 83, the first conductor 85, and the second conductors 86 are formed of, for example, silver and platinum. The insulating layer 84 and the protective layer 88 are formed of, for example, glass to which an inorganic oxide filler such as alumina is added. The heat-generating elements 87 are formed of, for example, Ta—SiO$_2$. The first trace 82, the second trace 83, the insulating layer 84, the first conductor 85, the second conductor 86, the heat-generating element 87, and the protective layer 88 may each be formed of any other material.

In the image forming apparatus 10 according to the first embodiment described above, the heat-generating elements 87 are juxtaposed to each other with spacing in the Y-axis direction and connected to the corresponding second conductors 86 and the first conductor 85. The heat-generating elements 87 generate heat when applied with a voltage. However, the gap 96 between the two adjacent heat-generating elements 87 is irrespective of heat generation, therefore, the gap 96 is lower in temperature than the heat-generating elements 87. In the first embodiment, the first protrusion 101 protrudes from the first conductor 85 toward the second conductors 86 in the Z-axis direction. In addition, the first protrusion 101 is at least partly located between the centers of the neighboring heat-generating elements 87A and 87B in the Y-axis direction. This arrangement works to shorten the electrical path between the first conductor 85 and the second conductor 86 in the vicinity of the gap 96 between the two adjacent heat-generating elements 87, which results in lowering electrical resistance and increasing the density of electric current flowing therein. Thus, the calorific value of the heat-generating elements 87 increases in the vicinity of the gap 96 therebetween, which increases the temperature in the gap 96 close to the temperature of the heat-generating elements 87 and contributes to reducing unevenness in color or gloss of the image due to an imbalanced temperature distribution.

The Z-axial length L1 of the first protrusion 101 elongates toward the gap 96. Specifically, the electrical path between the first conductor 85 and the second conductor 86 decreases toward the gap 96. Thus, the calorific value of the heat-generating elements 87 increases in the vicinity of the gap 96, which increases the temperature in the gap 96 close to the temperature of the heat-generating elements 87 and leads to reducing unevenness in color or gloss of the image due to an imbalanced temperature distribution of the heat-generating elements 87.

The length L2 of the first protrusion 101 is shorter than the length of the heat-generating element 87A connected to the first protrusion 101 in the Y-axis direction. This results in increasing the calorific value not of the entire heat-generating elements 87 but of the portion in the vicinity of the gap 96 between the two adjacent heat-generating elements 87. This can increase the temperature in the gap 96 toward the temperature of the heat-generating elements 87, reducing unevenness in color or gloss of the image due to an imbalanced temperature distribution of the heat-generating elements 87.

Second Embodiment

Figure 9:
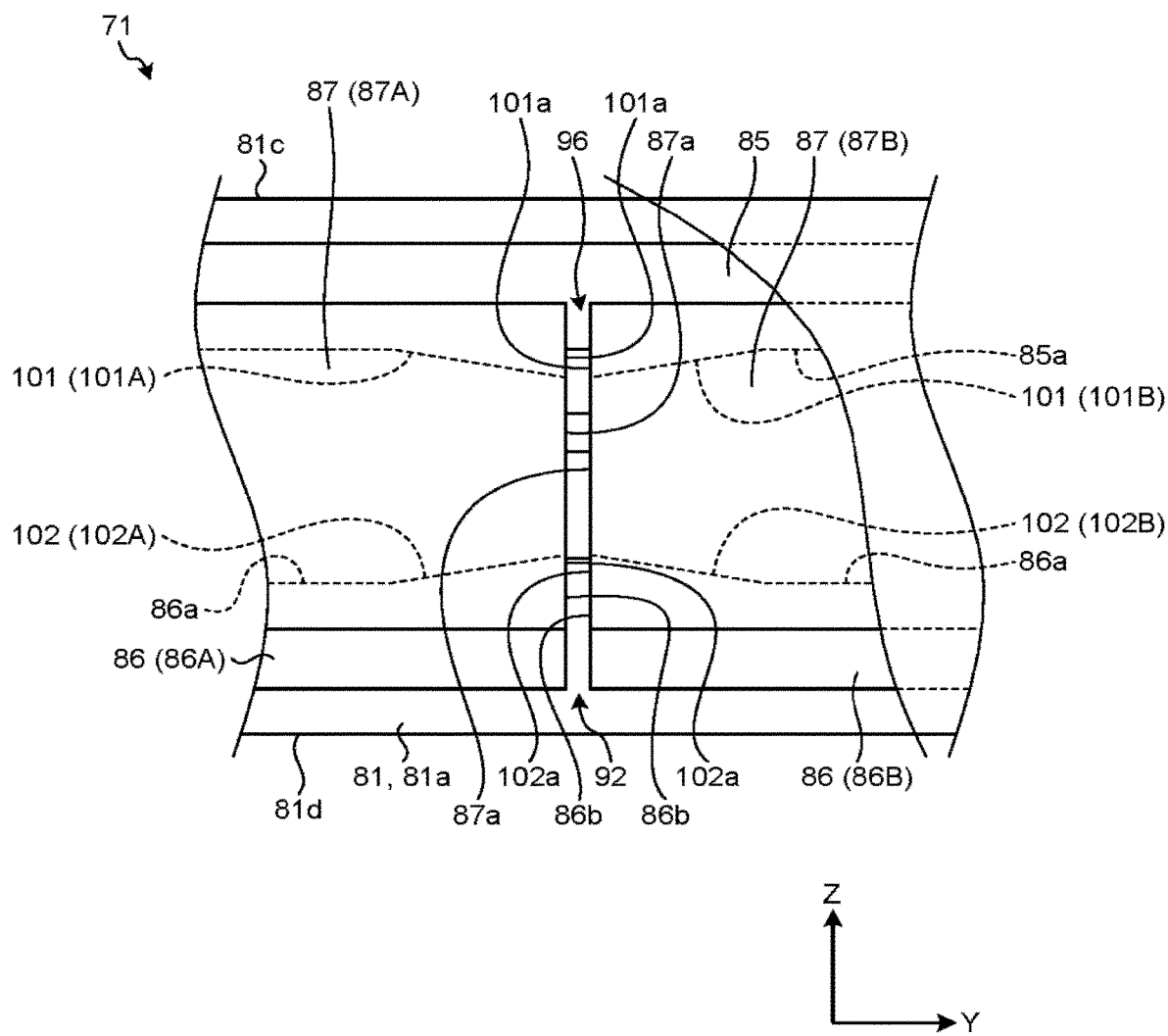
FIG. 9 is an exemplary schematic plan view illustrating a part of a heater in a second embodiment.

The following describes a second embodiment with reference to FIG. 9. In the following embodiments, elements having functions identical to the functions of the elements in the first embodiment are denoted by the same reference numerals and descriptions thereof may be omitted. A plurality of elements denoted by the same reference numeral does not necessarily have identical functions and characteristics and may have mutually different functions and characteristics.

FIG. 9 is an exemplary schematic plan view illustrating a part of a heater 71 in the second embodiment. As illustrated in FIG. 9, the heater 71 in the second embodiment additionally includes a plurality of first protrusions 101 and a plurality of second protrusions 102.

In the second embodiment, the first protrusions 101 are an exemplary first protruding conductor and the second protrusions 102 are an exemplary second protruding conductor. The first protrusions 101 may be an exemplary second protruding conductor and the second protrusions 102 may be an exemplary first protruding conductor.

In the following, the first protrusions 101 may be distinctively referred as first protrusions 101A and 101B. The second protrusions 102 may be distinctively referred to also as second protrusions 102A and 102B.

The first protrusion 101A is integrated with a first conductor 85. The first protrusion 101A protrudes from a first edge 85a of the first conductor 85 toward a second conductor 86A. Thus, the first protrusion 101A is located between the first conductor 85 and a plurality of second conductors 86 in the Z-axis direction. The first protrusion 101A is connected to a heat-generating element 87A.

The first protrusion 101B is integrated with the first conductor 85. The first protrusion 101B protrudes from the first edge 85a of the first conductor 85 toward a second conductor 86B. Thus, the first protrusion 101B is located between the first conductor 85 and the second conductors 86 in the Z-axis direction. The first protrusion 101B is connected to a heat-generating element 87B. The two first protrusions 101A and 101B are adjacent to each other with a gap 96 which lies between the heat-generating element 87A and the heat-generating element 87B.

The second protrusion 102A is integrated with the second conductor 86A. The second protrusion 102A protrudes from a second edge 86a of the second conductor 86A toward the first conductor 85. Thus, the second protrusion 102A is located between the first conductor 85 and the second conductors 86 in the Z-axis direction. The second protrusion 102A is connected to the heat-generating element 87A.

The second protrusion 102B is integrated with the second conductor 86B. The second protrusion 102B protrudes from the second edge 86a of the second conductor 86B toward the first conductor 85. Thus, the second protrusion 102B is located between the first conductor 85 and the second conductors 86 in the Z-axis direction. The second protrusion 102B is connected to the heat-generating element 87B. The second protrusion 102A and the second protrusion 102B are adjacent to each other with the gap 96.

The first protrusion 101A and the second protrusion 102A are at substantially the same position in the Y-axis direction, protruding toward each other. Thus, the first protrusion 101A and the second protrusion 102A are juxtaposed to each other with spacing in the axis direction.

The first protrusion 101A and the second protrusion 102A are both located in the vicinity of the g 96 between the two adjacent heat-generating elements 87A and 87B. Thus, the first protrusion 101A and the second protrusion 102A are at least partly located between the centers of the two adjacent heat-generating elements 87A and 87B in the Y-axis direction. Moreover, the first protrusion 101A and the second protrusion 102A are at least partly closer to the gap 96 between the heat-generating element 87A and the heat-generating element 87B than to the center of the adjacent heat-generating element 87A in the Y-axis direction.

Each of the first protrusion 101A and the second protrusion 102A has a Z-axial length which elongates toward the gap 96. A Y-axial end 101a of the first protrusion 101A and a Y-axial end 102a of the second protrusion 102A are aligned with an end 87a of the heat-generating element 87A in the X-axis direction.

The first protrusion 101A and the second protrusion 102A are shorter in length than the heat-generating element 87A in the Y-axis direction. The first protrusion 101A and the second protrusion 102A may nonetheless have the same length as the heat-generating element 87A in the Y-axis direction.

The first protrusion 101B and the second protrusion 102B are at substantially the same position in the Y-axis direction, protruding toward each other. Thus, the first protrusion 101B and the second protrusion 102B are juxtaposed to each other with spacing in the Z-axis direction.

The first protrusion 101B and the second protrusion 102B are both located in the vicinity of the gap 96 between the adjacent heat-generating elements 87B and 87A. Thus, the first protrusion 101B and the second protrusion 102B are at least partly located between the centers of the adjacent heat-generating elements 87B and in the Y-axis direction. Moreover, the first protrusion 101B and the second protrusion 102B are at least partly closer to the gap 96 between the heat-generating elements 87A and 87B than to the center of the heat-generating element 87B in the Y-axis direction.

Each of the first protrusion 101B and the second protrusion 102B has a Z-axial length which elongates toward the gap 96. A Y-axial end 101a of the first protrusion 101B and a Y-axial end 102a of the second protrusion 102B are aligned with an end 87a of the heat-generating element 87B in the X-axis direction.

The first protrusion 101B and the second protrusion 102B are shorter in length than the heat-generating element 87B in the Y-axis direction. The first protrusion 101B and the second protrusion 102B may nonetheless have the same length as the heat-generating element 87B in the Y-axis direction.

According to the image forming apparatus 10 of the second embodiment described above, the second protrusion 102A protrudes from the second conductor 86A toward the second conductors 86 in the Z-axis direction, is connected to the heat-generating element 87A connected to the first protrusion 101A, and is juxtaposed to the first protrusion 101A with spacing in the axis direction. This configuration can further shorten the electrical path between the first conductor 85 and the second conductor 86 in the vicinity of the gap 96 between the two adjacent heat-generating elements 87, which results in lowering electrical resistance and increasing density of flowing electric current therein. This can increase the calorific value of the heat-generating elements 97 in the vicinity of the gap 96 therebetween, thereby raising the temperature in the gap 96 close to the temperature of the heat-generating elements 87, and reducing unevenness in color or gloss of the image due to an imbalanced temperature distribution of the heat-generating elements 87.

The two first protrusions 101A and 101B are adjacent to each other with the gap 96. This arrangement can further increase the calorific value of the heat-generating elements 87 in the vicinity of the gap 96 therebetween, thereby increasing the temperature in the gap 96 close to the temperature of the heat-generating elements 87, and reducing unevenness in color or gloss of the image due to an imbalanced temperature distribution of the heat-generating elements 87.

Third Embodiment

Figure 10:
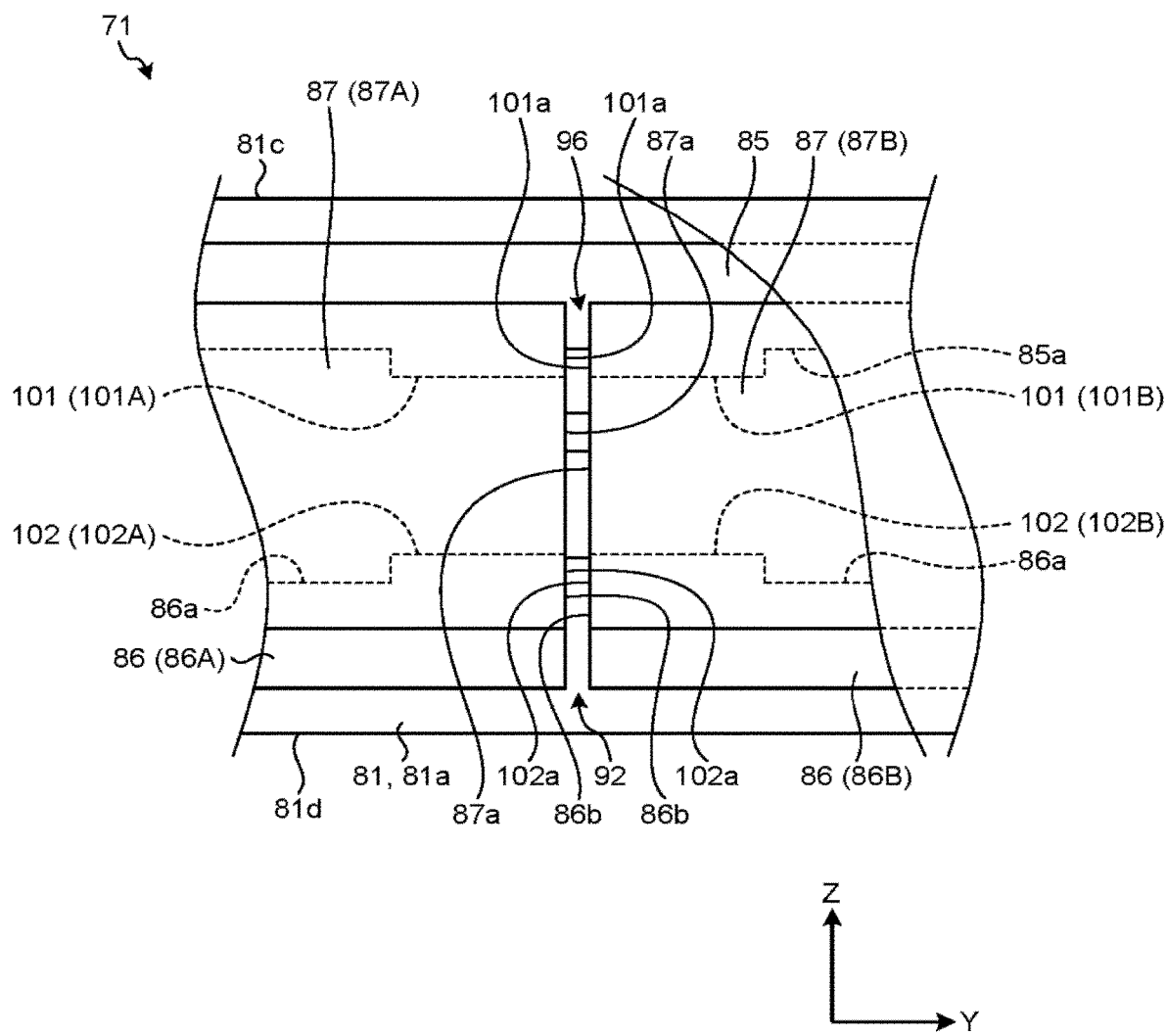
FIG. 10 is an exemplary schematic plan view illustrating a part a heater in a third embodiment.

The following describes a third embodiment with reference to FIG. 10. FIG. 10 is an exemplary schematic plan view illustrating a part of a heater 71 in the third embodiment. As illustrated in FIG. 10, the third embodiment differs from the second embodiment in that first protrusion 101A and 101B and second protrusions 102A and 102B have a substantially rectangular shape.

In the third embodiment, the first protrusions 101 each have a substantially constant length in the Z-axis direction. Similarly, the second protrusions 102 each have a substantially constant length in the Z-axis direction. Thus, in the third embodiment, the first protrusions 101 and the second protrusions 102 can be easily formed.

The first to third embodiments have described the example applying the heater 71 to the fuser device 46 of the image forming apparatus 10. The heater 71 may nonetheless be applied to any other apparatus, such as a thermal printer. In this case, the heat-generating element 87 functions to heat and melt ink in an ink ribbon and transfer the ink onto a medium such as the paper P.

According to at least one of the first to the third embodiments, the heat-generating elements are juxtaposed to each other with spacing in the first direction and are connected to the corresponding second conductors and the first conductor. The heat-generating elements generate heat by an applied voltage. The first protrusion protrudes from at least one of the first conductor and the second conductors to a location between the first conductor and the second conductors in the Z-axis direction. In addition, the first protrusion is at least partly located between the center of a first one of the heat-generating elements and the center of a second one of the heat-generating elements adjacent to the first heat-generating element in the first direction. As a result, the electrical path between the first conductor and the second conductor can be shortened in the vicinity of the gap between the two adjacent heat-generating elements, lowering electrical resistance and density of electric current flowing therethrough. This makes it possible to increase the calorific value of the heat-generating elements in the vicinity of the gap therebetween, and reduce the imbalance in the temperature distribution.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wiring structure comprising:
   a substrate;
   a first conductor that extends in a first direction;
   a plurality of second conductors that is spaced apart from the first conductor in a second direction and mutually juxtaposed with spacing in the first direction, the second direction being along one face of the substrate and crossing the first direction;
   a first trace on the face of the substrate, connected to the first conductor;
   a plurality of second traces that is apart from the first trace on the face, and connected to the second conductors, respectively;
   a plurality of heat-generating elements that generates heat by an applied voltage, the heat-generating elements that are spaced apart from the second traces and mutually juxtaposed with spacing in the first direction, and connected to the first conductor and to the second conductors, respectively; and a first protruding conductor that protrudes from either the first conductor and one of the second conductors to a location between the first conductor and the second conductors in the second direction, and is connected to a first one of the heat-generating elements, wherein the first protruding conductor is at least partly located between a center of the first one of the heat-generating elements and a center of a second one of the heat-generating elements in the first direction, the second one of the heat-generating elements being adjacent to the first one of the heat-generating elements.

2. The wiring structure according to claim 1, wherein the first protruding conductor has a length in the second direction shorter than a half of a length of the connected, first one of the heat-generating elements in the first direction.

3. The wiring structure according to claim 1, wherein the first protruding conductor has, in the second direction, a length which elongates toward a gap between the first one of the heat-generating elements and the second one of the heat-generating elements.

4. The wiring structure according to claim 1, wherein in the first direction, the first protruding conductor is shorter in length than the connected, first one of the heat-generating elements.

5. The wiring structure according to claim 1, further comprising a second protruding conductor that:

protrudes from the other of the first conductor and one of the second conductors to a location between the first conductor and the second conductors in the second direction, is connected to the first one of the heat-generating elements connected to the first protruding conductor, and is juxtaposed to the first protruding conductor with a gap in the second direction.

6. The wiring structure according to claim 1, wherein the first protruding conductor comprises a plurality of first protruding conductors, the first protruding conductors that:

protrude from either of the first conductor and one of the second conductors to a location between the first conductor and the second conductors in the second direction, and are connected to the heat-generating elements, respectively, and two of the first protruding conductors are adjacent each other with a gap between the first one of the heat-generating elements and the second one of the heat-generating elements.

7. A fuser device comprising:

the wiring structure according to claim 1; and a roller that applies pressure to a medium on which a toner image is formed, while the medium is heated by at least one of the heat-generating elements.

8. An image forming apparatus comprising:

the fuser device according to claim 7.

* * * * *